United States Patent
Lee et al.

(10) Patent No.: US 10,566,346 B2
(45) Date of Patent: Feb. 18, 2020

(54) VERTICAL-TYPE MEMORY DEVICE

(71) Applicant: SAMSUNG ELECTRONICS CO., LTD., Suwon-si, Gyeonggi-do (KR)

(72) Inventors: Tak Lee, Hwaseong-si (KR); Su Bin Kang, Suwon-si (KR); Ji Mo Gu, Seoul (KR); Yu Jin Seo, Daejeon (KR); Byoung Il Lee, Seoul (KR); Jun Ho Cha, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/108,834

(22) Filed: Aug. 22, 2018

(65) Prior Publication Data

US 2019/0244969 A1 Aug. 8, 2019

(30) Foreign Application Priority Data

Feb. 2, 2018 (KR) .......................... 10-2018-0013479

(51) Int. Cl.
| | |
|---|---|
| *H01L 27/11578* | (2017.01) |
| *H01L 27/11582* | (2017.01) |
| *H01L 27/11568* | (2017.01) |
| *H01L 29/10* | (2006.01) |
| *H01L 29/423* | (2006.01) |
| *H01L 21/285* | (2006.01) |
| *H01L 27/11565* | (2017.01) |
| *H01L 21/02* | (2006.01) |

(Continued)

(52) U.S. Cl.
CPC .. *H01L 27/11582* (2013.01); *H01L 21/28568* (2013.01); *H01L 27/11565* (2013.01); *H01L 27/11568* (2013.01); *H01L 29/1037* (2013.01); *H01L 29/4234* (2013.01); *H01L 21/02164* (2013.01); *H01L 21/02236* (2013.01); *H01L 21/28282* (2013.01); *H01L 21/31111* (2013.01); *H01L 29/40117* (2019.08)

(58) Field of Classification Search
CPC .................................................. H01L 27/11578
See application file for complete search history.

(56) References Cited

U.S. PATENT DOCUMENTS

| 7,679,133 B2 | 3/2010 | Son et al. |
| 8,030,700 B2 | 10/2011 | Sakamoto |

(Continued)

FOREIGN PATENT DOCUMENTS

KR 10-1622036 5/2016

*Primary Examiner* — Peniel M Gumedzoe
*Assistant Examiner* — Christopher A Johnson
(74) *Attorney, Agent, or Firm* — F. Chau & Associates, LLC

(57) ABSTRACT

A vertical-type memory device includes a substrate having a cell array region and a connection region disposed adjacent to the cell array region, a plurality of gate electrode layers stacked on the cell array region and the connection region, a plurality of channel structures disposed in the cell array region, a plurality of dummy channel structures disposed in the connection region, and a plurality of slits disposed in the plurality of gate electrode layers in the cell array region. The plurality of gate electrode layers forms a stepped structure in the connection region, the plurality of channel structures penetrates the plurality of gate electrode layers, and the plurality of dummy channel structures penetrates at least one of the plurality of gate electrode layers.

19 Claims, 17 Drawing Sheets

(51) Int. Cl.
　　　*H01L 21/311*　　　(2006.01)
　　　*H01L 21/28*　　　(2006.01)

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,916,926 B2 | 12/2014 | Choe et al. |
| 8,951,865 B2 | 2/2015 | Goda |
| 9,099,202 B2 | 8/2015 | Mihnea et al. |
| 9,299,714 B2 | 3/2016 | Seo et al. |
| 9,384,995 B2 | 7/2016 | Simsek-Ege et al. |
| 9,634,024 B2 | 4/2017 | Kanamori et al. |
| 9,679,947 B2 | 6/2017 | Yamato et al. |
| 2011/0233648 A1 | 9/2011 | Seol et al. |
| 2015/0263036 A1 | 9/2015 | Yasuda et al. |
| 2016/0343728 A1 | 11/2016 | Song |
| 2017/0077110 A1* | 3/2017 | Liu .................. H01L 27/11524 |
| 2017/0207232 A1* | 7/2017 | You .................. H01L 27/11521 |

\* cited by examiner

VERTICAL-TYPE MEMORY DEVICE

CROSS-REFERENCE TO RELATED APPLICATIONS

This application claims priority under 35 U.S.C. § 119 to Korean Patent Application No. 10-2018-0013479 filed on Feb. 2, 2018, the disclosure of which is incorporated by reference herein in its entirety.

TECHNICAL FIELD

Exemplary embodiments of the present inventive concept relate to a vertical-type memory device.

DISCUSSION OF THE RELATED ART

As advancements in technology are made, electronic products are increasingly requiring high-capacity data processing while also being reduced in size. Accordingly, a higher degree of integration of semiconductor memory devices used in such electronic products is needed. To this end, a vertical-type memory device in which memory cells having a vertical-type transistor structure, instead of a conventional planar transistor structure, are stacked, is being implemented in electronic products.

SUMMARY

Exemplary embodiments of the inventive concept provide a vertical-type memory device in which an RC delay difference between an upper end word line and a lower end word line is decreased.

According to an exemplary embodiment of the inventive concept, a vertical-type memory device includes a substrate having a cell array region and a connection region disposed adjacent to the cell array region, a plurality of gate electrode layers stacked on the cell array region and the connection region, a plurality of channel structures disposed in the cell array region, a plurality of dummy channel structures disposed in the connection region, and a plurality of slits disposed in the plurality of gate electrode layers in the cell array region. The plurality of gate electrode layers forms a stepped structure in the connection region, the plurality of channel structures penetrates the plurality of gate electrode layers, and the plurality of dummy channel structures penetrates at least one of the plurality of gate electrode layers.

According to an exemplary embodiment of the inventive concept, a vertical-type memory device includes a substrate, a first gate electrode layer extending in a first direction on the substrate, and a second gate electrode layer extending in the first direction on the substrate. The second gate electrode layer is disposed on the first gate electrode layer. The vertical-type memory device further includes a plurality of channel structures penetrating the first gate electrode layer and the second gate electrode layer, a first slit disposed in the first gate electrode layer, and a second slit disposed in the second gate electrode layer. The first slit and the second slit are disposed between the channel structures, and a size of the second slit is larger than a size of the first slit.

According to an exemplary embodiment of the inventive concept, a vertical-type memory device includes a substrate, a plurality of gate electrode layers stacked on the substrate and extending in a first direction on the substrate, a plurality of channel structures penetrating the plurality of gate electrode layers, and a plurality of separation patterns extending in the first direction. The separation patterns are spaced apart from one another in a second direction that is substantially perpendicular to the first direction. The plurality of gate electrode layers includes a plurality of slits disposed between the plurality of channel structures.

According to an exemplary embodiment of the inventive concept, a vertical-type memory device includes a substrate including a cell array region and a connection region disposed adjacent to the cell array region, a plurality of gate electrode layers stacked on the cell array region and the connection region, in which the plurality of gate electrode layers forms a stepped structure in the connection region, a plurality of channel structures disposed in the cell array region, in which the plurality of channel structures penetrates the plurality of gate electrode layers, and a plurality of slits disposed in the plurality of gate electrode layers between the plurality of channel structures in the cell array region.

BRIEF DESCRIPTION OF DRAWINGS

The above and other features of the present inventive concept will become more apparent by describing in detail exemplary embodiments thereof with reference to the accompanying drawings, in which.

DETAILED DESCRIPTION

Figure 1:
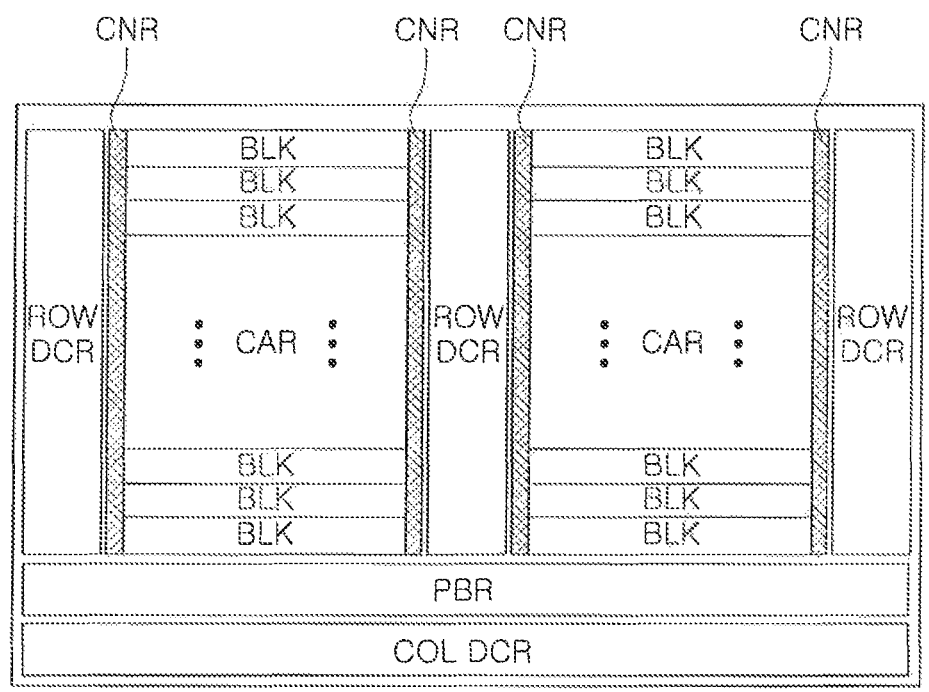
FIG. 1 is a diagram illustrating a schematic configuration of a vertical-type memory device according to an exemplary embodiment of the inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will further be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a diagram illustrating a schematic configuration of a vertical-type memory device according to exemplary embodiments of the inventive concept.

Referring to FIG. 1, in an exemplary embodiment, a vertical-type memory device includes a cell array region CAR and peripheral circuit regions. The peripheral circuit regions includes row decoder regions ROW DCR, a page buffer region PBR, a column decoder region COL DCR, and a control circuit region. According to exemplary embodiments, a connection region CNR is disposed between the cell array region CAR and the row decoder regions ROW DCR.

A memory cell array including a plurality of memory cells may be disposed in the cell array region CAR. In exemplary embodiments, the memory cell array may include memory cells arranged three-dimensionally, and a plurality of word lines and bit lines electrically connected to the memory cells.

A row decoder that selects word lines of the memory cell array may be disposed in the row decoder region ROW DCR, and a wiring structure including contact plugs and wires electrically connecting the memory cell array and the row decoder may be disposed in the connection region CNR. One of the word lines of the memory cell array may be selected by the row decoder according to address information. The row decoder may provide word line voltages to selected word lines and unselected word lines, respectively, in response to a control signal of a control circuit.

A page buffer that reads information stored in the memory cells may be disposed on the page buffer region PBR. The page buffer may temporarily store data to be stored in the memory cells, or sense data stored in the memory cells, according to an operation mode. The page buffer may be operated as a write driver circuit in a program operation mode, and may be operated as a sense amplifier circuit in a read operation mode.

A column decoder connected to the bit lines of the memory cell array may be arranged in the column decoder region COL DCR. The column decoder may provide a data transfer path between the page buffer and an external device (e.g., a memory controller).

The cell array region CAR includes a plurality of cell array blocks BLK. Each of the cell array blocks BLK may include gate electrode layers stacked on a substrate to form three-dimensionally arranged memory cells, and channel structures including a channel and a gate dielectric layer. Each of the cell array blocks BLK may include bit lines electrically connected to the memory cells.

Figure 2:
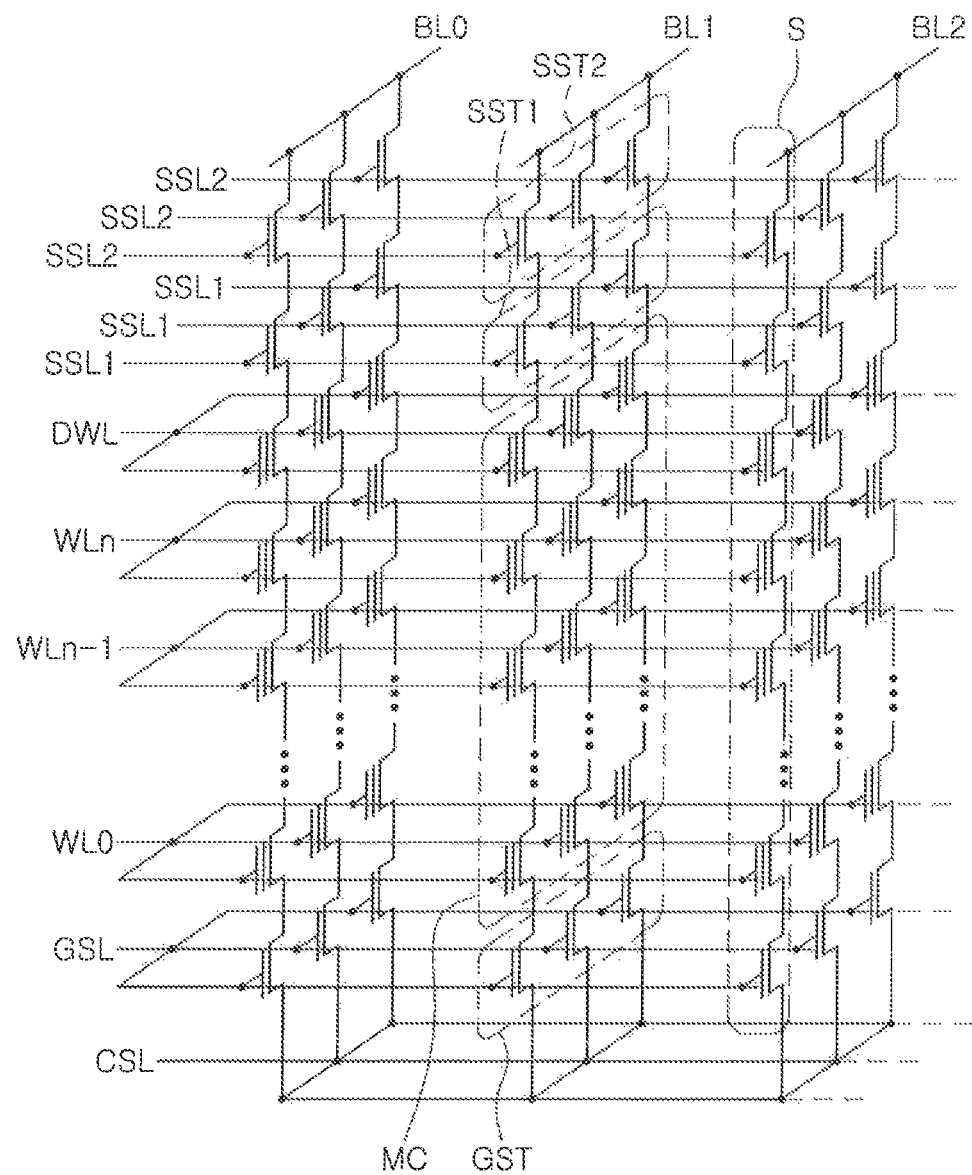
FIG. 2 is a conceptual circuit diagram illustrating a cell array region CAR of FIG. 1.

FIG. 2 is a conceptual circuit diagram illustrating the cell array region CAR of FIG. 1.

Referring to FIG. 2, in an exemplary embodiment, the memory cell array includes a plurality of memory cell strings S including memory cells MC connected to one another in series, and a ground selection transistor GST and string selection transistors SST1 and SST2 connected to both ends of the memory cells MC in series. The plurality of memory cell strings S is connected to each of bit lines BL0-BL2 in parallel. The plurality of memory cell strings S is connected to a common source line CSL in common. For example, a plurality of memory cell strings S may be disposed between a plurality of bit lines BL0-BL2 and one common source line CSL. In an exemplary embodiment, common source lines CSL may be two-dimensionally arranged in plural.

The memory cells MC connected to one another in series may be controlled by word lines WL0-WLn for selecting the memory cells MC, where n is an integer equal to at least 2. Each of the memory cells MC may include a data storage element. The gate electrodes of the memory cells MC disposed at substantially the same distance from the common source line CSL may be connected to one of the word lines WL0-WLn in common to be in an equipotential state. Alternatively, even in a case in which the gate electrodes of the memory cells MC are arranged at substantially the same distance from the common source lines CSL, the gate electrodes arranged in different rows or columns may be independently controlled.

The ground selection transistor GST may be controlled by a ground selection line GSL, and may be connected to the common source line CSL. The string selection transistor SST may be controlled by string selection lines SSL1 and SSL2, and may be connected to the bit lines BL0-BL2. Although FIG. 2 illustrates an exemplary embodiment in which one ground selection transistor GST and two string selection transistors SST1 and SST2 are connected to a plurality of memory cells MC connected in series, exemplary embodiments of the inventive concept are not limited thereto. For example, according to exemplary embodiments, one ground selection transistor GST and two string selection transistors SST1 and SST2 may be connected to each other, or a plurality of ground selection transistors GST may be connected. One or more dummy lines DWL or buffer lines may be further disposed between an uppermost word line WLn and string selection lines SSL1 and SSL2. In an exemplary embodiment, one or more dummy lines DWL may be disposed between a lowermost word line WL0 and a ground selection line GSL.

When a signal is applied to the string selection transistors SST1 and SST2 through the string selection lines SSL1 and SSL2, the signals applied through the bit lines BL0, BL1 and BL2 may be transmitted to the memory cells MC connected to one another in series to perform data reading and writing operations. Further, by applying a predetermined erase voltage through a substrate, an erasing operation for erasing data recorded in the memory cells MC may be performed. In an exemplary embodiment, a memory cell array includes at least one dummy memory cell string electrically isolated from the bit lines BL0-BL2.

Figure 3:
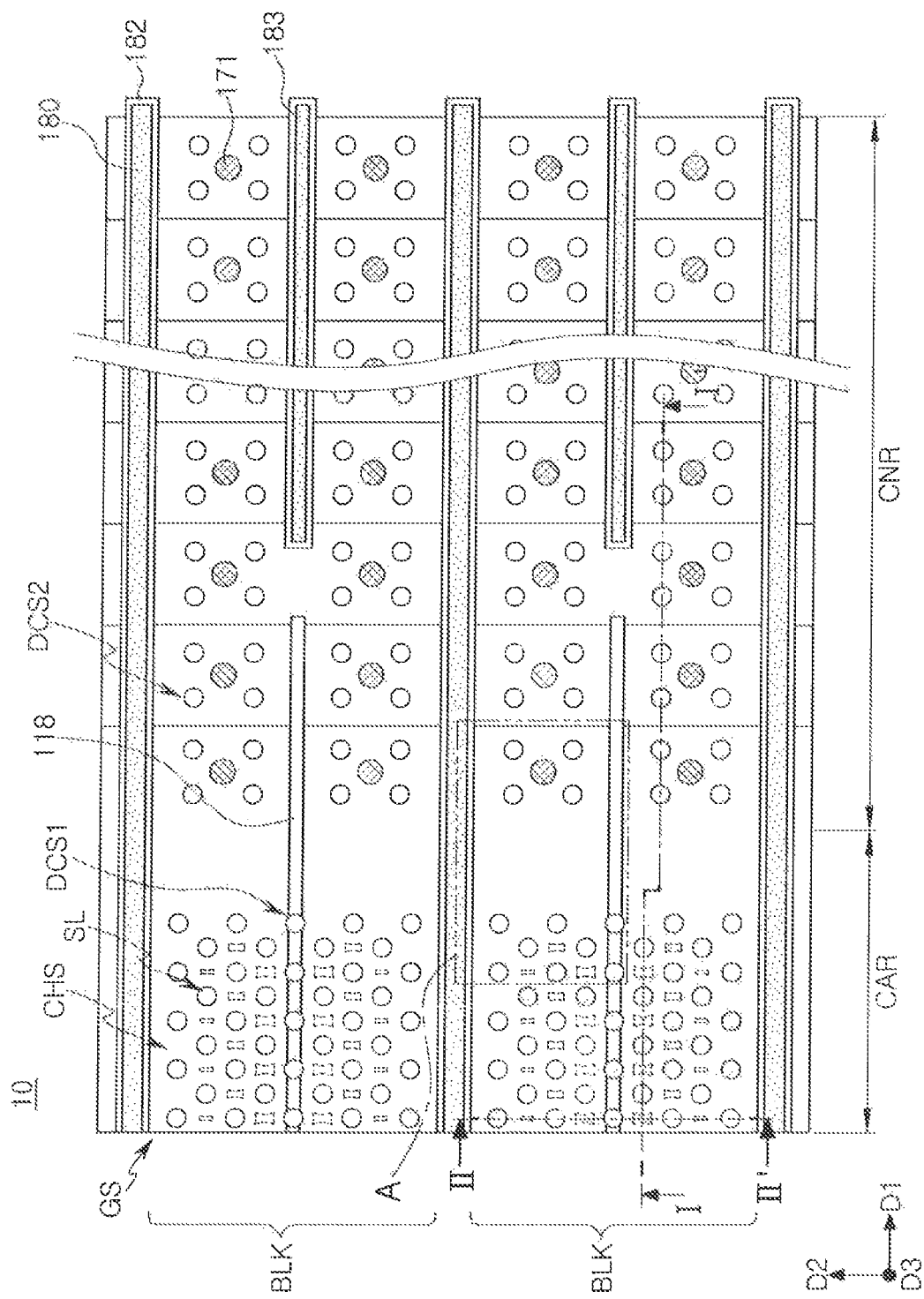
FIG. 3 is a schematic plan view of a vertical-type memory device according to an exemplary embodiment of the inventive concept.
Figure 4:
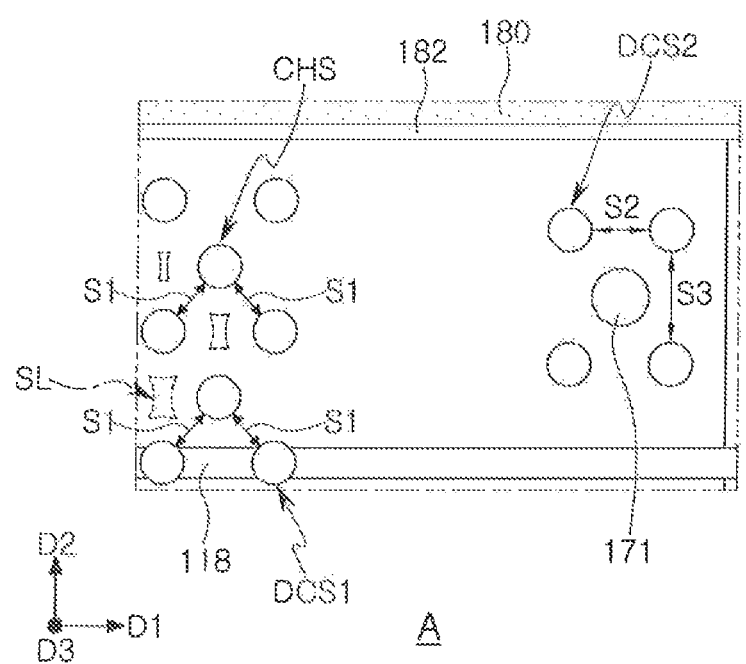
FIG. 4 is an enlarged view of region A in FIG. 3.

FIG. 3 is a schematic plan view of a vertical-type memory device 10 according to an exemplary embodiment of the inventive concept. FIG. 4 is an enlarged view of region 'A' in FIG. 3.

Referring to FIGS. 3 and 4, in an exemplary embodiment, a vertical-type memory device 10 includes a cell array region CAR in which memory cells are formed, and a connection region CNR for connecting the gate electrodes of the memory cells to wirings. The cell array region CAR and the connection region CNR together constitute a memory cell region.

In an exemplary embodiment, a stacked structure GS extending in a first direction D1 is disposed in the cell array region CAR and the connection region CNR. The stacked structure GS may include a plurality of gate electrode layers and a plurality of mold insulation layers alternately stacked on the substrate. The stacked structure GS may be divided into a plurality of cell array blocks BLK by a plurality of separation patterns 180. The plurality of separation patterns 180 continuously extend in the first direction D1 in the cell array region CAR and the connection region CNR. The plurality of separation patterns 180 may be electrically connected to the substrate, and may be made of a conductive material. For example, the plurality of separation patterns 180 may include at least one of a metal such as tungsten, copper, titanium, aluminum, etc., a doped semiconductor, and a conductive metal nitride, etc. The plurality of separation patterns 180 may be common source lines. The plurality of separation patterns 180 is electrically insulated from the gate electrode layers of the stacked structure GS. An insulation layer 182 may be disposed between the plurality of separation patterns 180 and the stacked structure GS. The insulation layer 182 is made of an insulating material. For example, the insulation layer 182 may include silicon oxide ($SiO_2$), silicon nitride ($Si_3N_4$), silicon oxynitride (SiON), or a combination thereof. An auxiliary separation pattern 183 may be disposed between the separation patterns 180 in the connection region CNR. The auxiliary separation pattern 183 may be made of a conductive material. The auxiliary separation pattern 183 is electrically insulated from a gate electrode layer 131 (see FIG. 5) by the insulation layer 182.

In an exemplary embodiment, a plurality of channel structures CHS to be connected to the substrate through the stacked structure GS, and a plurality of first dummy channel structures DCS1 penetrating a string insulation layer 118, are disposed in the cell array region CAR. A plurality of second dummy channel structures DCS2 to be connected to the substrate through the stacked structure GS, and a plurality of contact plugs 171 to be connected to the plurality of gate electrode layers, are disposed in the connection region CNR.

In an exemplary embodiment, the plurality of channel structures CHS is disposed in a plurality of rows and columns. The plurality of channel structures CHS may be disposed, for example, in a hexagonal lattice pattern or in a zigzag pattern. Three adjacent channel structures CHS may be disposed at the vertex of an equilateral triangle. Line segments connecting the centers of the three adjacent channel structures CHS may form an equilateral triangle. The three adjacent channel structures CHS may be disposed in a first gap S1 in an inclined direction with regard to the first direction D1 and a second direction D2. The second direction D2 is substantially perpendicular to the first direction D1. It is to be understood that the arrangement of the plurality of channel structures CHS is not limited to the configuration illustrated in FIG. 3, and may be variously modified.

In an exemplary embodiment, slits SL are disposed between the plurality of channel structures CHS. The slits SL may be arranged in a zigzag form. A size of the slits SL in the horizontal direction (a size of the slits SL in the first direction D1 and a size of the slits SL in the second direction D2) may be increased as a distance from the separation pattern 180 increases. For example, in an exemplary embodiment, the size of the slits SL in the horizontal direction increases as the slits SL become further away from the separation pattern 180. In an exemplary embodiment, the slits SL are formed in the gate electrode layers. In an exemplary embodiment, the slits SL are empty spaces in which materials forming the gate electrode layers are not filled. In an exemplary embodiment, each of the slits SL has a first side surface and a second side surface facing each other in the first direction D1, and a third side surface and a fourth side surface facing each other in the second direction D2. In an exemplary embodiment, the first to fourth side surfaces have a concave shape.

In an exemplary embodiment, the stacked structure GS forms a stepped structure including a plurality of stepped layers in the connection region CNR. The stepped structure may be formed by extending the plurality of gate electrode layers and the plurality of mold insulation layers of the stacked structure GS different distances from one another. The plurality of stepped layers may be provided in pad regions in which a plurality of contact plugs 171 is disposed.

In an exemplary embodiment, the plurality of second dummy channel structures DCS2 is arranged to penetrate the plurality of stepped layers. Four adjacent second dummy channel structures DCS2 may be disposed at vertices of a tetragonal form. Adjacent four channel structures CHS may be disposed at vertices of a tetragonal form. The four adjacent second dummy channel structures DCS2 may be disposed to have a second spacing S2 in the first direction D1 and to have a third spacing S3 in the second direction D2. In an exemplary embodiment, the second spacing S2 and the third spacing S3 are substantially the same. In an exemplary embodiment, the second spacing S2 and the third spacing S3 are wider than the first spacing S1.

It is to be understood that the arrangement of a plurality of second dummy channel structures DCS2 is not limited to the arrangement illustrated herein. For example, in an exemplary embodiment, slits SL are disposed between the second dummy channel structures DCS2.

In an exemplary embodiment, the plurality of channel structures CHS is connected to bit lines for read/write operations, and the plurality of first and second dummy channel structures DCS1 and DCS2 is not connected to bit lines. Therefore, the plurality of second dummy channel structures DCS2 may serve to support the stack structure GS in the connection region CNR.

In an exemplary embodiment, a diameter of the plurality of channel structures CHS is about equal to a diameter of the plurality of second dummy channel structures DCS2. In an exemplary embodiment, a diameter of the plurality of channel structures CHS is smaller than a diameter of the plurality of second dummy channel structures DCS2.

Figure 5:
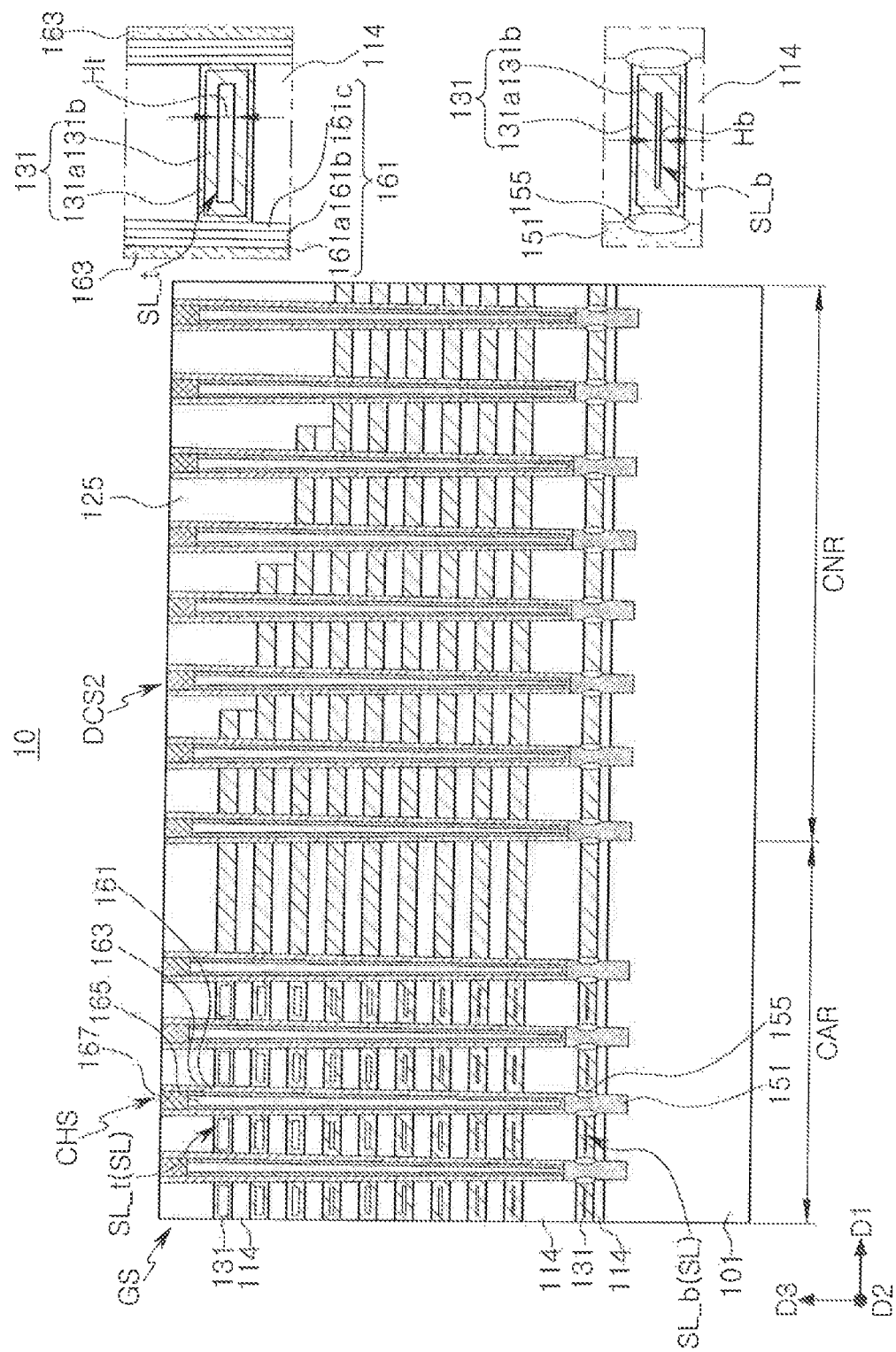
FIGS. 5 and 6 are schematic cross-sectional views of a vertical-type memory device according to an exemplary embodiment of the inventive concept.
Figure 6:
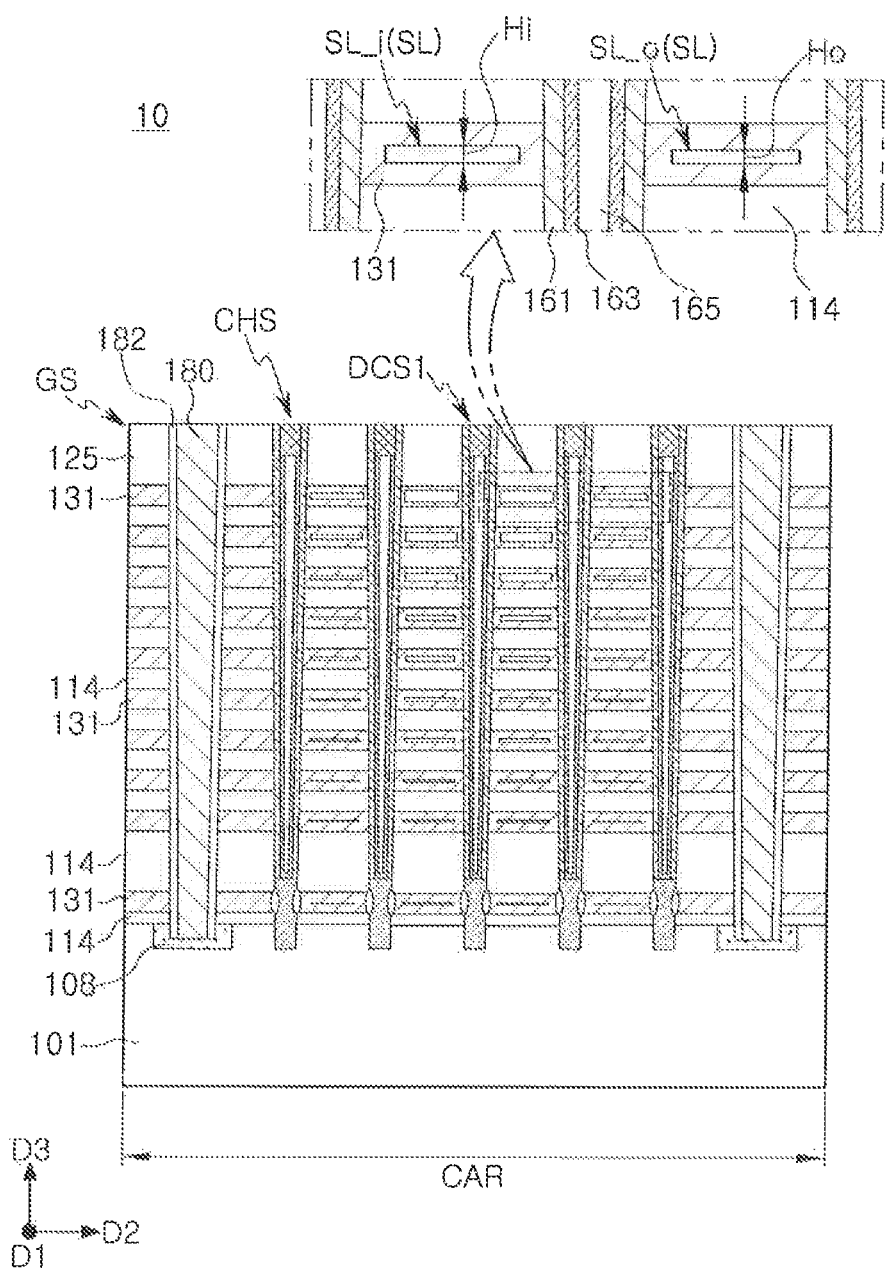

FIGS. 5 and 6 are schematic cross-sectional views of a vertical-type memory device 10 according to an exemplary embodiment of the inventive concept. FIG. 5 is a cross-sectional view taken along line I-I' of FIG. 3, and FIG. 6 is a cross-sectional view taken along line II-II' of FIG. 3.

Referring to FIGS. 5 and 6, in an exemplary embodiment, a vertical-type memory device 10 includes a substrate 101, a stacked structure GS, channel structures CHS, first dummy channel structures DCS1, and second dummy channel structures DCS2.

The substrate 101 may include a semiconductor material such as, for example, a Group IV semiconductor, a Group III-V compound semiconductor, or a Group II-VI compound semiconductor. The stacked structure GS includes a plurality of gate electrode layers 131 and a plurality of mold insulation layers 114 alternately stacked on the substrate 101. The plurality of gate electrode layers 131 is stacked on the substrate 101 in a third direction D3 substantially perpendicular to the upper surface of the substrate 101. The plurality of gate electrode layers 131 extends in the first direction D1, and is disposed in the cell array region CAR and the connection region CNR. The stacked structure GS has a stepped structure including a plurality of stepped layers in the connection region CNR. The plurality of gate electrode layers 131 extends different distances in the first direction D1 to form a stepped structure in the connection region CNR.

For example, as shown in FIG. 6, in an exemplary embodiment, each of the gate electrode layers 131 fully extends through the cell array region CAR in the first direction D1. That is, in the cell array region CAR, the gate electrode layers 131 extend the same distance in the first direction D1 such that they do not form a stepped structure in the cell array region CAR. Once the gate electrode layers 131 extend into the connection region CNR, the gate electrode layers 131 extend different distances in the first direction D1 to form a stepped structure. For example, as shown in FIG. 6, in an exemplary embodiment, the distances at which the gate electrode layers 131 extend in the connection region CNR (in a direction away from the cell array region CAR) in the first direction D1 increases as the gate electrode layers 131 are disposed closer to the substrate 101. The mold insulation layers 114 also form a stepped structure together with the gate electrode layers 131.

Herein, the plurality of gate electrode layers 131 may be collectively referred to as a gate electrode layer 131. In addition, the lowermost gate electrode layer 131 from among the plurality of gate electrode layers 131 may be referred to as the lowermost portion of the gate electrode layer 131, and the uppermost gate electrode layer 131 from among the plurality of gate electrode layers 131 may be referred to as an uppermost portion of the gate electrode layer 131.

The gate electrode layers 131 and the mold insulation layers 114 together constitute a stacked structure GS. The gate electrode layers 131 may include, for example, a metal, a metal nitride, a metal silicide, polycrystalline silicon, or a combination thereof.

The metal may include, for example, tungsten (W), copper (Cu), or aluminum (Al). The metal silicide may be, for example, a silicide material including at least one metal selected from cobalt (Co), nickel (Ni), hafnium (Hf), platinum (Pt), tungsten (W) and titanium (Ti), and combinations thereof. The gate electrode layers 131 include a first conductive layer 131a and a second conductive layer 131b, respectively. The second conductive layer 131b covers the first conductive layer 131a. The first conductive layer 131a may include a metal material such as, for example, a metal silicide material, polycrystalline silicon, or a combination thereof. The second conductive layer 131b may be formed of a metal nitride. The metal nitride may include, for example, tungsten nitride (WN), tantalum nitride (TaN), titanium nitride (TiN), or combinations thereof. The mold insulation layers 114 may include, for example, silicon oxide. In an exemplary embodiment, a thickness of the plurality of gate electrode layers 131 is thicker than a thickness of the plurality of mold insulation layers 114.

It is to be understood that the number of the plurality of gate electrode layers 131 is not limited to that illustrated in FIG. 5. For example, in exemplary embodiments, the number of the gate electrode layers 131 constituting memory cells may be increased to increase a storage capacity of the vertical-type memory device 10. For example, dozens to hundreds of the gate electrode layers 131 may be stacked on the substrate 101 in an exemplary embodiment.

In an exemplary embodiment, the vertical-type memory device includes an interlayer insulation layer 125 that covers a stepped structure of the stacked structure GS, and that is disposed in the connection region CNR. The interlayer insulation layer 125 may include, for example, silicon oxide or a low dielectric material. The low dielectric material may be, for example, an insulating material having a lower dielectric constant than that of the silicon oxide.

In an exemplary embodiment, a plurality of channel structures CHS penetrating the plurality of gate electrode layers 131 is disposed in the cell array region CAR. A diameter of the plurality of channel structures CHS may be gradually reduced closer to the substrate 101. For example, in an exemplary embodiment, the diameter of the channel structures CHS is gradually reduced as the channel structures CHS are disposed closer to the substrate 101. A spacing between the plurality of channel structures CHS may be gradually widened closer to the substrate 101. For example, in an exemplary embodiment, the spacing between the channel structures CHS is gradually widened (e.g., increased) as the channel structures CHS are disposed closer to the substrate 101. In an exemplary embodiment, slits SL are formed in the plurality of gate electrode layers 131 between the plurality of channel structures CHS in the cell array region CAR. In an exemplary embodiment, the slits SL are empty spaces in which conductive materials forming the gate electrode layers 131 are not filled. In an exemplary embodiment, the slits SL are surrounded by the second conductive layer 131b. The second conductive layer 131b surrounding the slits SL may have a surface roughness. A size of the slits SL in the vertical direction (the size of the slits SL in the third direction D3) may be smaller closer to the substrate 101. For example, in an exemplary embodiment, the size of the slits SL in the vertical direction is smaller as the slits SL are disposed closer to the substrate 101. In an exemplary embodiment, the gate electrode layer 131 disposed on an uppermost portion includes uppermost slits SL_t having a first size Ht, and the gate electrode layer 131 disposed on a lowermost portion includes lowermost slits SL_b having a second size Hb. In an exemplary embodiment, the first size Ht is larger than the second size Hb. For example, the first size Ht may be between about 7.5 nm and about 11 nm, and the second size Hb may be between about 2.5 nm and about 6 nm.

Referring to FIG. 6, in an exemplary embodiment, a vertical size of the slits SL of the gate electrode layers 131 is increased as the distance from the separation pattern 180 increases. For example, in an exemplary embodiment, the vertical size of the slits SL of the gate electrode layers 131 increases as the corresponding gate electrode layers 131 are disposed further from the separation pattern 180. In an exemplary embodiment, four slits SL are formed in one gate electrode layer 131 between a pair of separation patterns 180. In an exemplary embodiment, a vertical size Ho of outside slits SL_o close to the separation pattern 180 is smaller than a vertical size Hi of inside slits SL_i close to the first dummy channel structure DCS1. In an exemplary embodiment, the separation pattern 180 is in contact with an impurity region 108 of the substrate 101. The impurity region 108 may be doped with an n-type impurity. In an exemplary embodiment, a width of the separation pattern 180 may become narrower closer to the substrate 101. For example, in an exemplary embodiment, the width of the separation pattern 180 becomes smaller as the separation pattern 180 is disposed closer to the substrate 101.

In an exemplary embodiment, the plurality of second dummy channel structures DCS2 penetrating at least a portion of the plurality of gate electrode layers 131 is disposed in the connection region CNR. In an exemplary embodiment, slits SL are not formed between the plurality of second dummy channel structures DCS2. In an exemplary embodiment, slits SL having a smaller size in the vertical direction than slits SL formed in the cell array region CAR are formed in the connection region CNR.

In an exemplary embodiment, a plurality of channel structures CHS disposed in the cell array region CAR includes an epitaxial layer 151, a gate dielectric layer 161, a channel layer 163, an insulation layer 165, and a contact pad 167. In an exemplary embodiment, the plurality of first and second dummy channel structures DCS1 and DCS2 have the same stacked structure as the plurality of channel structures CHS.

In an exemplary embodiment, the epitaxial layer 151 is disposed between the channel layer 163 and the substrate 101, and electrically connects the channel layer 163 and the substrate 101. In an exemplary embodiment, a height of an upper surface of the epitaxial layer 151 is greater than a height of an upper surface of a lowermost portion of a gate electrode layer 131.

The epitaxial layer 151 may be formed by a selective epitaxial growth process. The epitaxial layers 151 may include a semiconductor material such as, for example, monocrystalline silicon.

In an exemplary embodiment, the gate dielectric layer 161 is disposed between the gate electrode layer 131 and the channel layer 163. In an exemplary embodiment, the gate dielectric layer 161 is formed to surround an external surface of the channel layer 163. In an exemplary embodiment, the gate dielectric layer 161 includes a tunneling layer 161a, a charge trap layer 161b, and a blocking layer 161c, which are sequentially disposed on the external surface of the channel layer 163.

The tunneling layer 161a may include, for example, silicon oxide. The charge trap layer 161b may include, for example, silicon nitride. The blocking layer 161c may include, for example, silicon oxide ($SiO_2$), silicon nitride ($Si_3N_4$), silicon oxynitride (SiON), or a high dielectric constant dielectric material. The high dielectric constant dielectric material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

In an exemplary embodiment, the channel layer 163 includes an inner space, which may be filled with the insulation layer 165. The channel layer 163 may include a semiconductor material such as, for example, polycrystalline silicon, monocrystalline silicon, etc. The insulation layer 165 may include an insulating material such as, for example, silicon oxide. The contact pad 167 may include a semiconductor material such as, for example, polycrystalline silicon.

In an exemplary embodiment, insulation layers 155 are locally disposed between the epitaxial layers 151 and the lowermost portion of the gate electrode layer 131.

Figure 7:
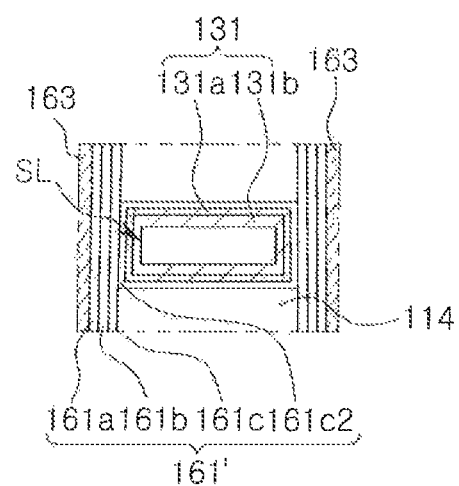
FIG. 7 is a view illustrating a region of a semiconductor device according to an exemplary embodiment of the inventive concept.

FIG. 7 is a view illustrating a region of a semiconductor device according to an exemplary embodiment of the inventive concept.

Referring to FIG. 7, in an exemplary embodiment, a gate electrode layer 131, a slit SL, a gate dielectric layer 161', a channel layer 163, and a mold insulation layer 114 are included in a region of a semiconductor device. The gate dielectric layer 161' has a structure in which a tunneling layer 161a, a charge trap layer 161b, and blocking layers 161c1 and 161c2 are sequentially stacked on the channel layer 163.

Unlike the exemplary embodiment of FIG. 5, the gate dielectric layer 161' included in the exemplary embodiment of FIG. 7 includes a first blocking layer 161c1 and a second blocking layer 161c2. In this case, the first blocking layer 161c1 extends in a vertical direction similar to the channel layer 163, and the second blocking layer 161c2 surrounds the gate electrode layer 131. The first blocking layer 161c1 may be made of, for example, silicon oxide, and the second blocking layer 161c2 may be made of, for example, the high dielectric constant material described above.

Figure 8:
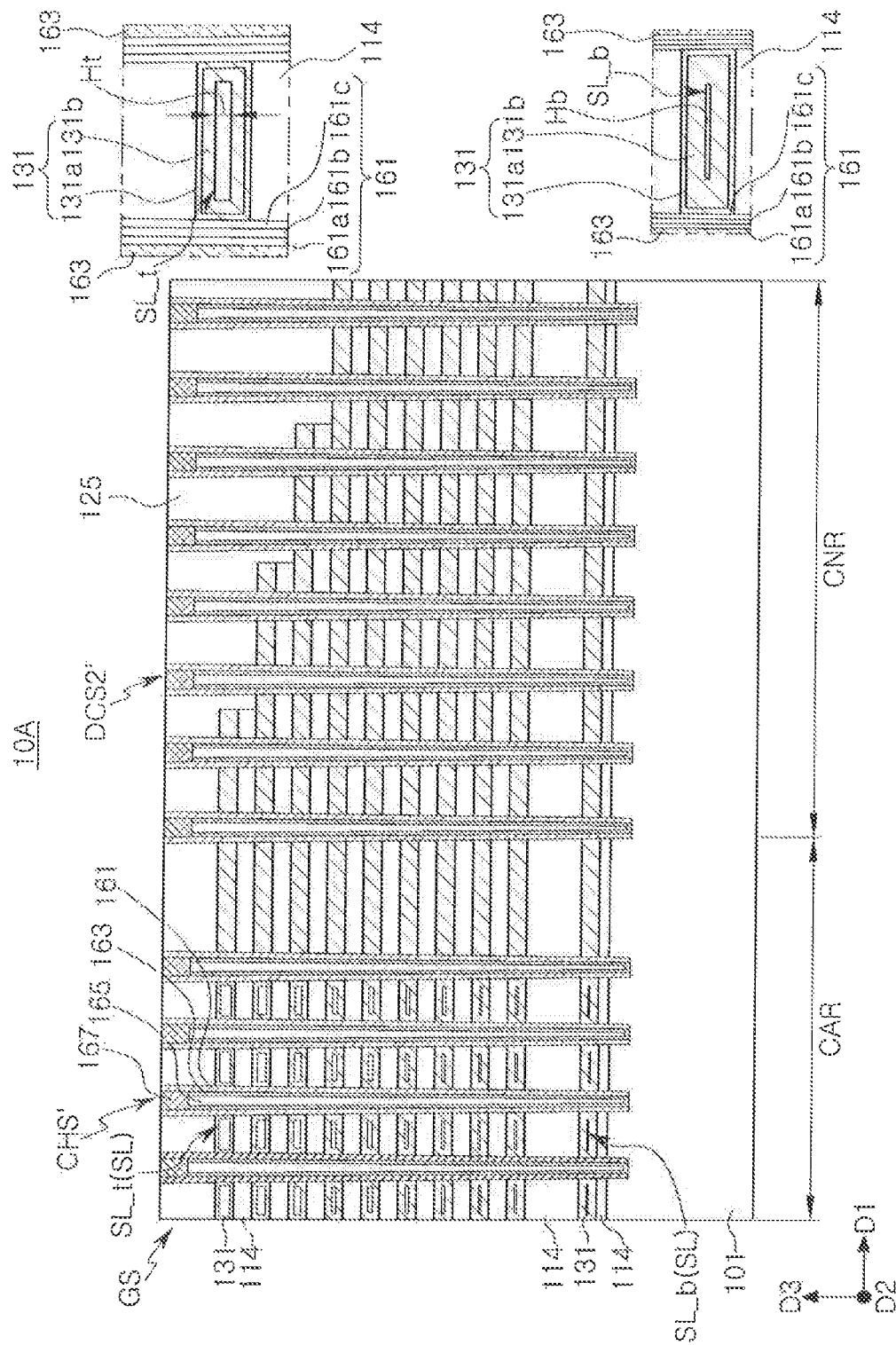
FIGS. 8 and 9 are schematic cross-sectional views of a vertical-type memory device according to an exemplary embodiment of the inventive concept.
Figure 9:
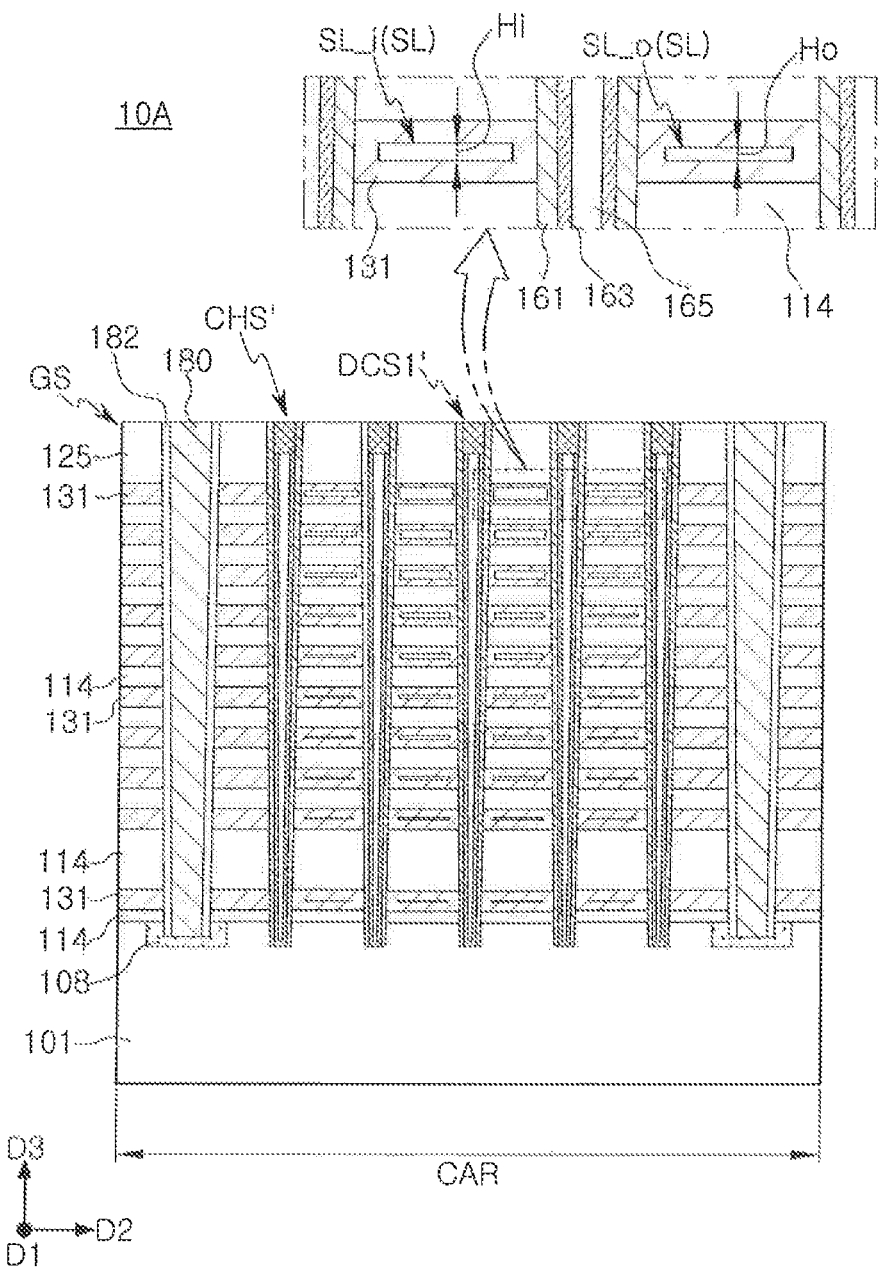

FIGS. 8 and 9 are schematic cross-sectional views of a vertical-type memory device 10A according to an exemplary embodiment of the inventive concept. FIG. 8 is a cross-sectional view corresponding to FIG. 5, and FIG. 9 is a cross-sectional view corresponding to FIG. 6. For convenience of explanation, a further description of elements previously described with reference to FIGS. 5 and 6 will be omitted, and the description will primarily focus on the differences between FIGS. 8 and 9 and FIGS. 5 and 6.

Referring to FIGS. 8 and 9, in an exemplary embodiment, channel structures CHS', first dummy channel structures DCS1', and second dummy channel structures DCS2' do not include an epitaxial layer 151 and an insulation layer 155. Thus, in the exemplary embodiment of FIGS. 8 and 9, the channel layer 163 and the gate dielectric layer 161 are in direct contact with the substrate 101.

In an exemplary embodiment, a size of the slits SL in a vertical direction (a size of the slits SL in the third direction D3) is smaller closer to the substrate 101. For example, in an exemplary embodiment, the size of the slits SL in the vertical direction is smaller as the slits SL are disposed closer to the substrate 101. In addition, in an exemplary embodiment, the size of the slits SL in the vertical direction is increased as a distance from the separation pattern 180 increases. For example, in an exemplary embodiment, the size of the slits SL in the vertical direction increases as the slits SL are disposed further from the separation pattern 180.

Figure 10:
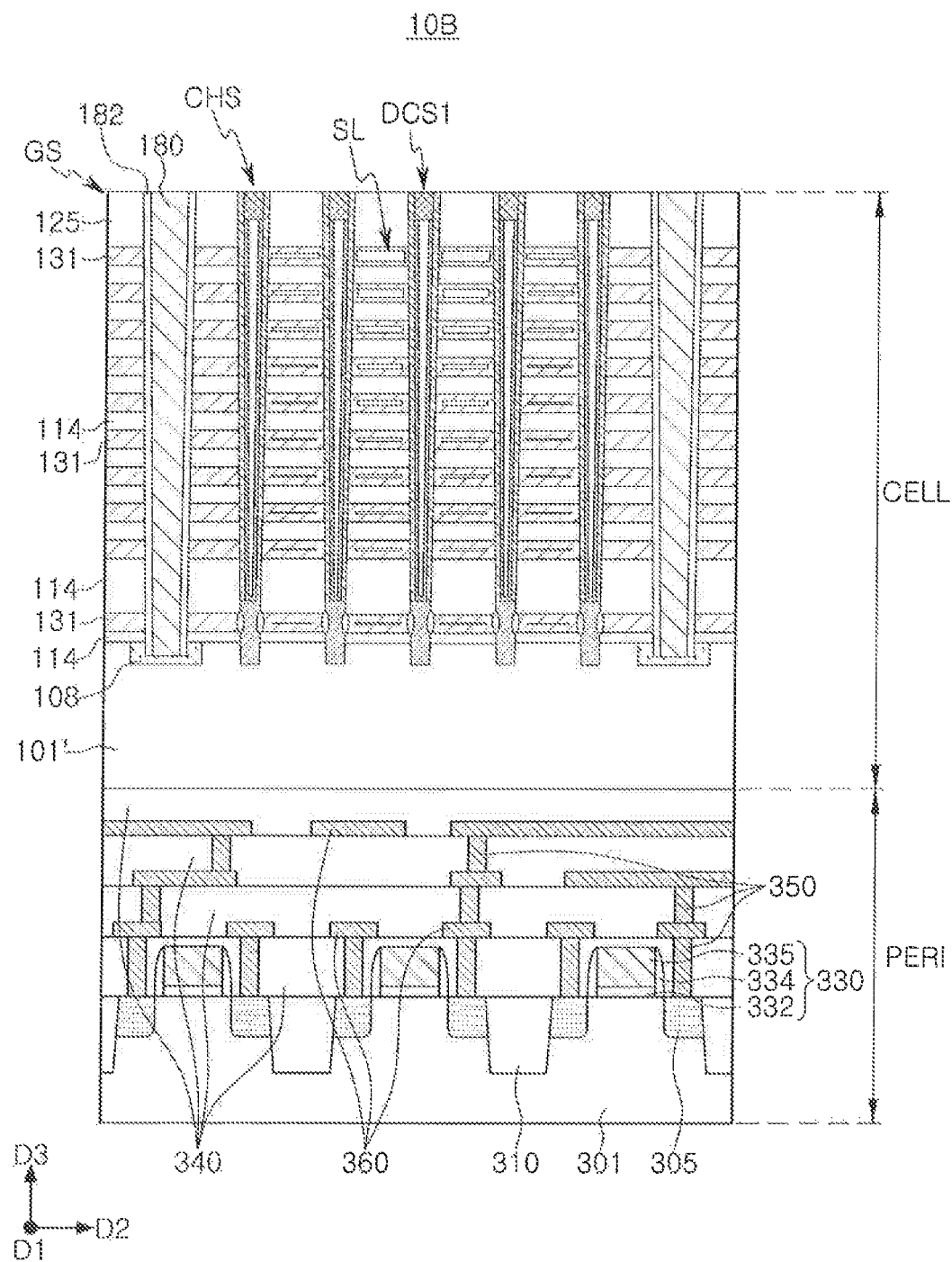
FIG. 10 is a schematic view of a vertical-type memory device according to an exemplary embodiment of the inventive concept.

FIG. 10 is a schematic view of a vertical-type memory device 10B according to an exemplary embodiment of the inventive concept.

Referring to FIG. 10, in an exemplary embodiment, a vertical-type memory device 10B includes a memory cell region CELL and a peripheral circuit region PERI. The memory cell region CELL is disposed on the peripheral circuit region PERI. In an exemplary embodiment, the memory cell region CELL may be disposed below the peripheral circuit region PERI.

In an exemplary embodiment, the memory cell region CELL includes a substrate 101', gate electrode layers 131 and mold insulation layers 114 alternately stacked on the substrate 101', as described above with reference to FIG. 6, channel structures CHS, first dummy channel structures DCS1, slits SL, and separation patterns 180. The substrate 101' may include, for example, polycrystalline silicon.

In an exemplary embodiment, the peripheral circuit region PERI includes a base substrate 301, circuit elements 330 disposed on the base substrate 301, contact plugs 350, and wiring lines 360.

In an exemplary embodiment, element isolation layers 310 are formed in the base substrate 301 and define active regions. Source/drain regions 305 containing impurities are disposed on a portion of the active region. The base substrate 301 may include a semiconductor material such as, for example, a Group IV semiconductor, a Group III-V compound semiconductor, or a Group II-VI oxide semiconductor.

In an exemplary embodiment, the circuit elements 330 includes planar transistors. In an exemplary embodiment, the circuit elements 330 includes a circuit gate insulation layer 332, a spacer layer 334, and a circuit gate electrode 335, respectively. The source/drain regions 305 are disposed in the base substrate 301 on both sides of the circuit gate electrode 335 and serve as a source region or a drain region of the circuit element 330.

In an exemplary embodiment, a plurality of peripheral region insulation layers 340 is disposed on the circuit elements 330 on the base substrate 301. Contact plugs 350 are connected to the source/drain regions 305 through the peripheral region insulation layers 340. An electrical signal may be applied to the circuit element 330 by the contact plugs 350. In the region not illustrated, the contact plugs 350 may also be connected to the circuit gate electrode 335. Wiring lines 360 are connected to the contact plugs 350, and are arranged in a plurality of layers.

The vertical-type memory device 10B may be manufactured by forming the peripheral circuit region PERI first, and by then forming the memory cell region CELL thereon. The substrate 101' may have substantially the same size as the base substrate 301, or may be smaller than the base substrate 301. The memory cell region CELL and the peripheral circuit region PERI may be connected to each other in a region that is not illustrated. For example, one end of the gate electrode layer 131 in the first direction D1 may be electrically connected to the circuit element 330.

FIGS. 11A to 11F are diagrams that schematically illustrate a method of fabricating a vertical-type memory device 10 according to an exemplary embodiment of the inventive concept. FIG. 12 is a gas injection flow diagram for a deposition process illustrating a method of manufacturing a vertical-type memory device according to an exemplary embodiment of the inventive concept.

Figure 11A:
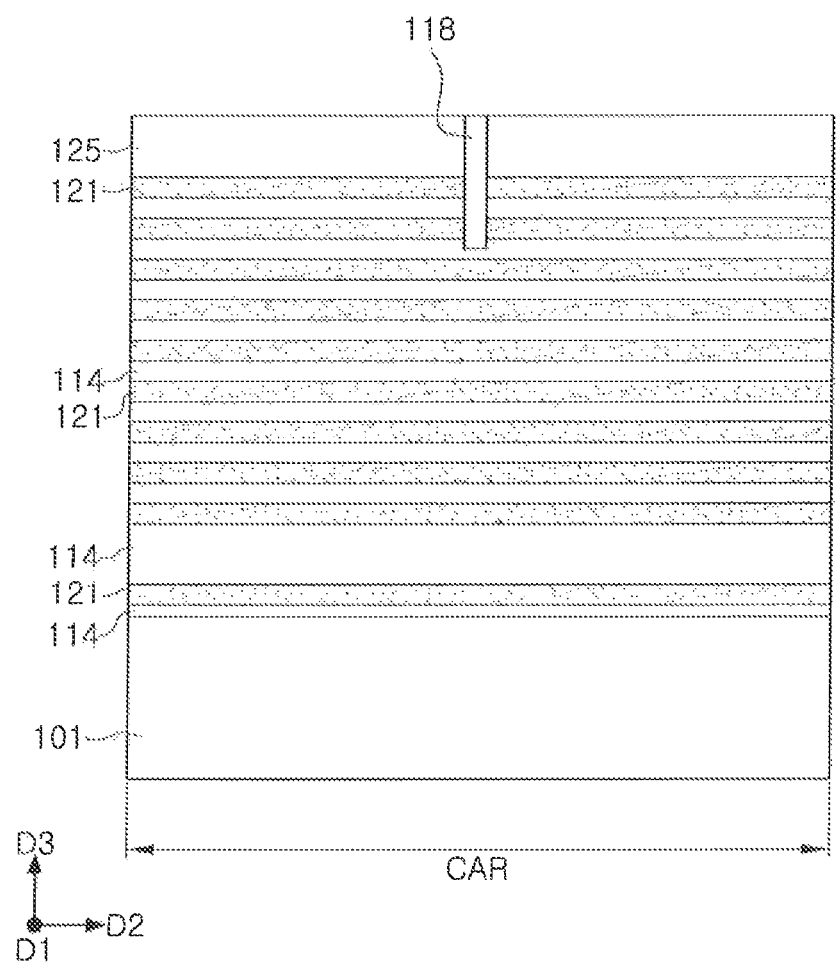
FIGS. 11A to 11F are drawings schematically illustrating a method of manufacturing a vertical-type memory device according to an exemplary embodiment of the inventive concept.
Figure 12:
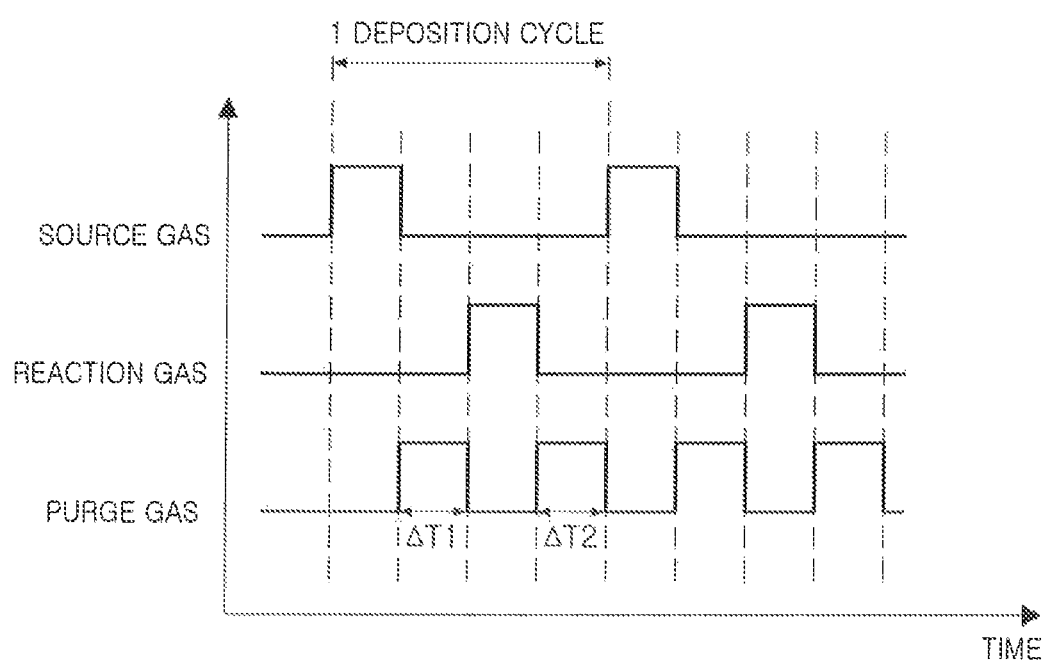
FIG. 12 is a gas injection flow diagram for a deposition process illustrating a method of manufacturing a vertical-type memory device according to an exemplary embodiment of the inventive concept.

Referring to FIG. 11A, in an exemplary embodiment, sacrificial layers 121, mold insulation layers 114, and an interlayer insulation layer 125 are formed on a substrate 101.

The mold insulation layer 114 is formed first on an upper surface of the substrate 101, and then the sacrificial layers 121 and the mold insulation layers 114 are alternately formed. Portions of the mold insulation layers 114 may have different thicknesses, and the number of the mold insulation layers 114 and the number of sacrificial layers 121 may be varied. The sacrificial layers 121 may be formed of a material having etch selectivity with the mold insulation layers 114. For example, the mold insulation layers 114 may be made of at least one of silicon oxide and silicon nitride, and the sacrificial layers 121 may be selected from silicon, silicon oxide, silicon carbide, and silicon nitride.

The interlayer insulation layer 125 covering the sacrificial layers 121 and the mold insulation layers 114 is formed. A string insulation layer 118 is formed that divides a portion of the sacrificial layers 121 and a portion of the mold insulation layers 114.

Figure 11B:
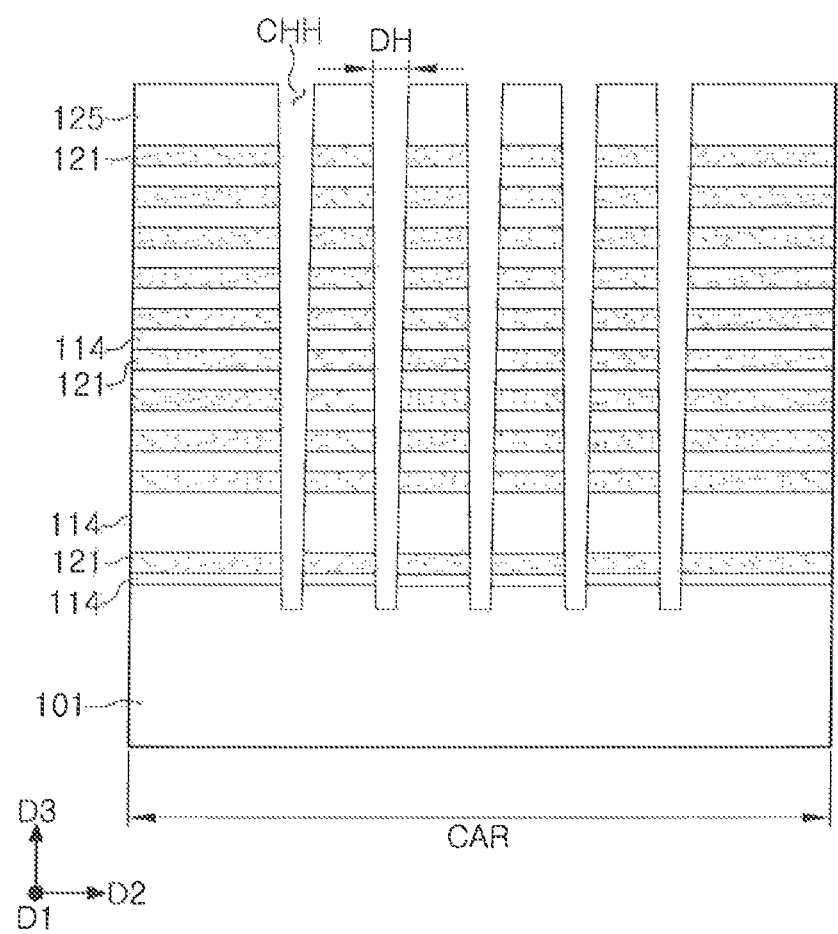

Referring to FIG. 11B, channel holes CHH penetrating the sacrificial layers 121, the mold insulation layers 114, and the interlayer insulation layer 125 are formed in the cell array region CAR by an anisotropic etching process. Dummy channel holes penetrating the sacrificial layers 121, the mold insulation layers 114, and the interlayer insulation layer 125 may be formed together in a connection region. The channel holes CHH extend to the substrate 101, and recesses are formed on an upper portion of the substrate 101. Diameters DH of the channel holes CHH are reduced closer to the upper surface of the substrate 101. For example, in an exemplary embodiment, the diameters DH of the channel holes CHH decrease as the channel holes CHH become closer to the upper surface of the substrate 101. A spacing between the channel holes CHH is increased closer to the upper surface of the substrate 101. For example, in an exemplary embodiment, the spacing between the channel holes CHH increases as the channel holes CHH become closer to the upper surface of the substrate 101.

Figure 11C:
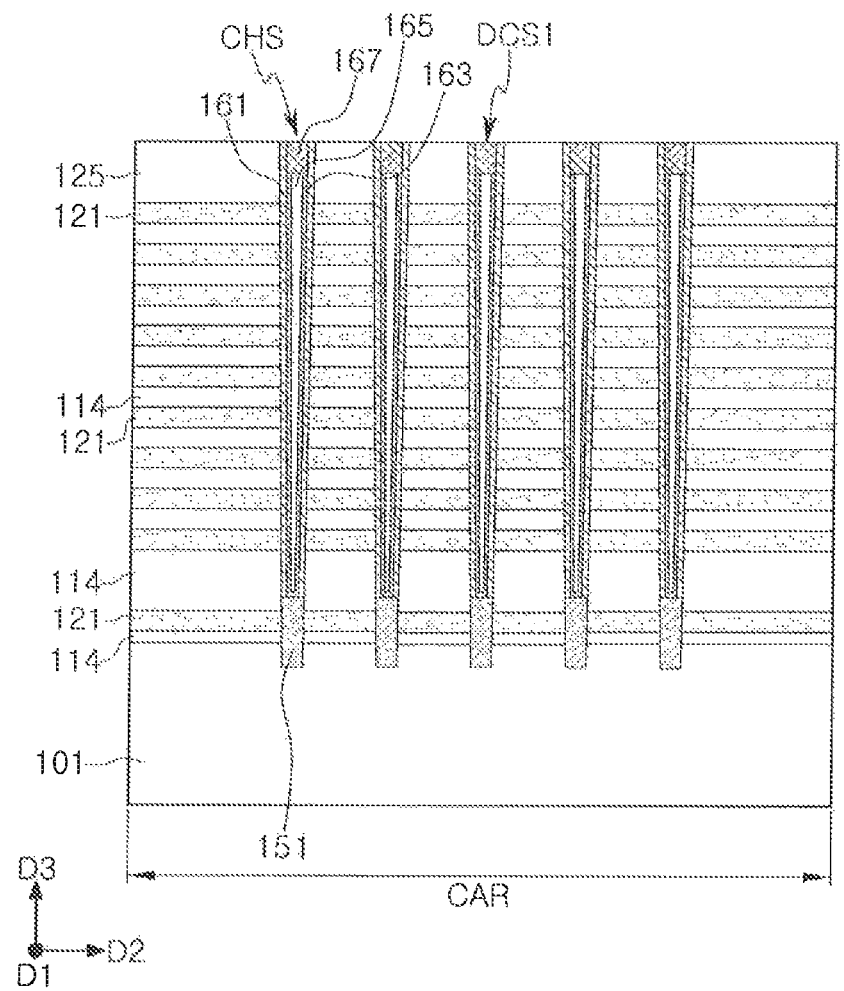

Referring to FIG. 11C, channel structures CHS and a first dummy channel structure DCS1 are formed in the cell array region CAR.

Second dummy channel structures may be formed together in the connection region.

First, epitaxial layers 151 are formed on a lower portion of the channel holes CHH. The epitaxial layers 151 may be formed by performing a selective epitaxial growth (SEG) process using the substrate 101 as a seed. The epitaxial layers 151 may be formed of a semiconductor material such as, for example, silicon. The epitaxial layers 151 may be doped with impurities during a selective epitaxial process. The impurity may be an impurity of the same conductivity type as, or an impurity of the opposite conductivity type to, an impurity in the substrate 101.

Gate dielectric layers 161 covering sidewalls of the channel holes CHH are formed. The gate dielectric layers 161 may include, for example, a blocking layer, a charge storage layer, and a tunneling layer, which are sequentially formed. The gate dielectric layer 161 may be formed by, for example, a vapor deposition process.

Channel layers 163 covering the gate dielectric layer 161 in the channel holes CHH are formed. The channel layers 163 may be made of a semiconductor material such as, for example, polycrystalline silicon or amorphous silicon.

Then, insulation layers 165 filling remaining space of the channel holes CHH are formed. Contact pads 167 are formed on the channel layers 163. The insulation layers 165 may be formed of an insulating material such as, for example, silicon oxide. The contact pads 167 may be, for example, a doped semiconductor material.

Figure 11D:
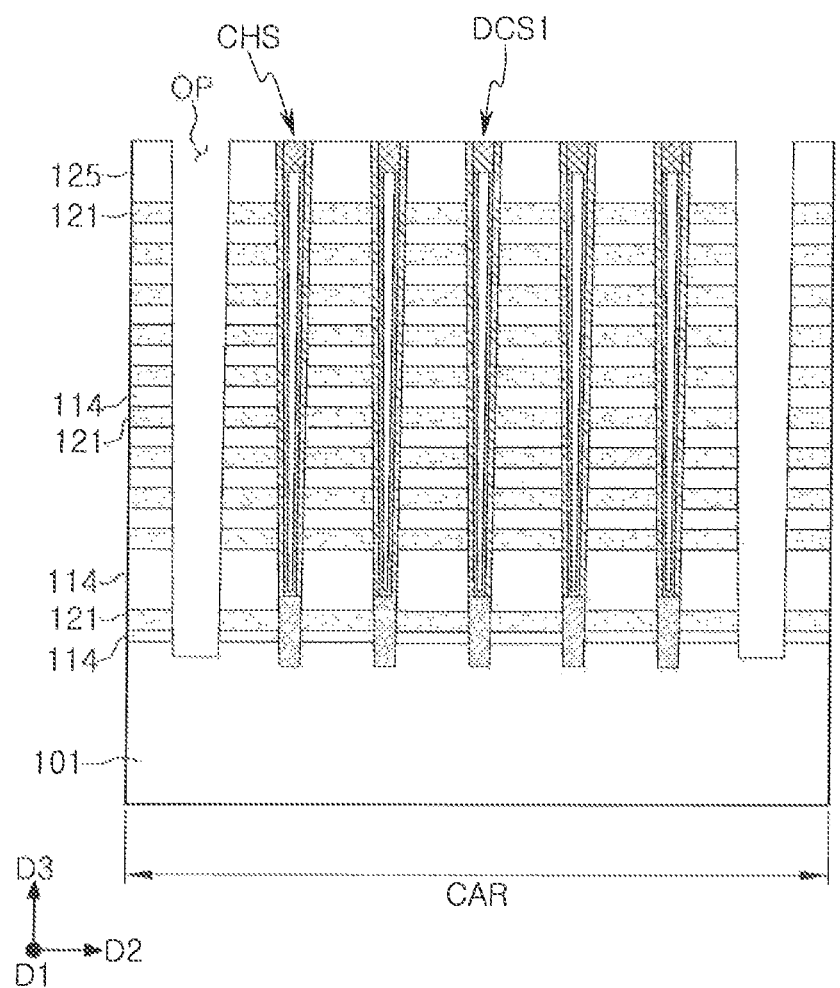

Referring to FIG. 11D, the sacrificial layers 121, the mold insulation layers 114, and the interlayer insulation layer 125 are penetrated by an anisotropic etching process, thus forming separation regions OP. The separation regions OP are spaced apart from one another at a predetermined interval in the second direction D2. The separation regions OP extend to the substrate 101, and recesses are formed on an upper portion of the substrate 101.

Figure 11E:
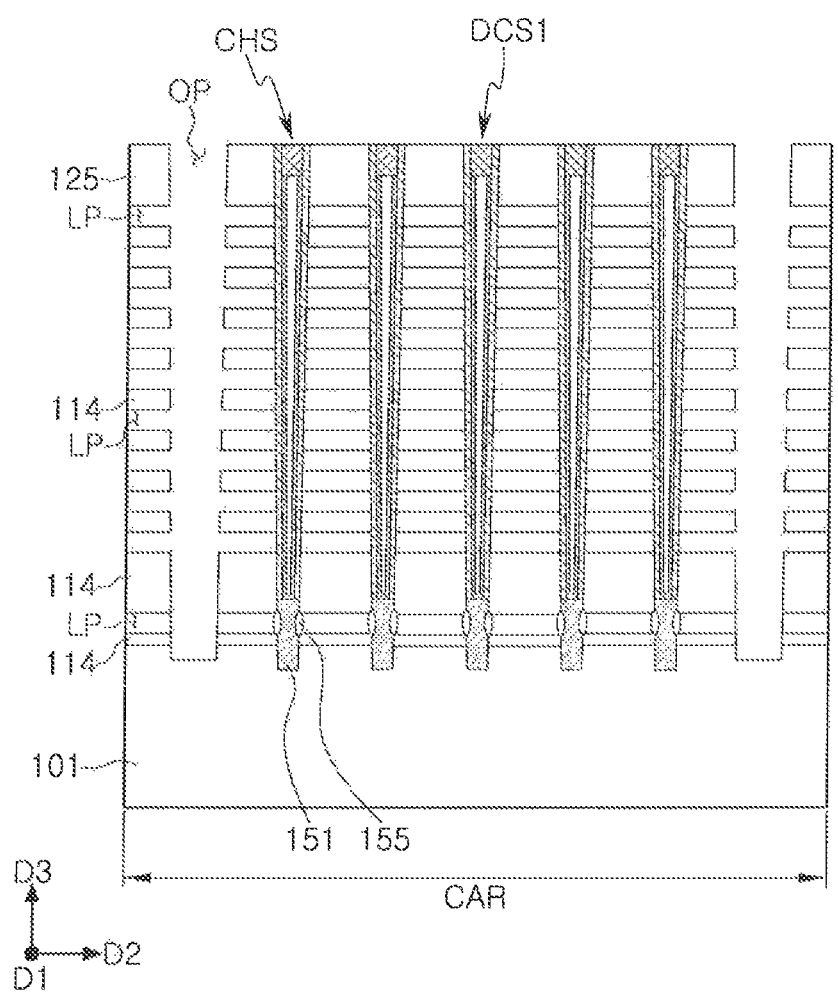

Referring to FIG. 11E, the sacrificial layers 121 are removed by, for example, a wet etching process, and a plurality of lateral openings LP is formed between the mold insulation layers 114. A gate dielectric layer 161 and an epitaxial layer 151 are partially exposed through the lateral openings LP. When the sacrificial layers 121 are silicon nitride and the mold insulation layers 114 are silicon oxide, the wet etch process may be performed using a phosphoric acid solution.

Next, insulation layers 155 are formed by an oxidation process on sidewalls of the cell epitaxial layers 151 exposed through the lateral openings LP. The insulation layers 155 may be formed, for example, in a ring shape along the sidewalls of the cell epitaxial layer 151.

Figure 11F:
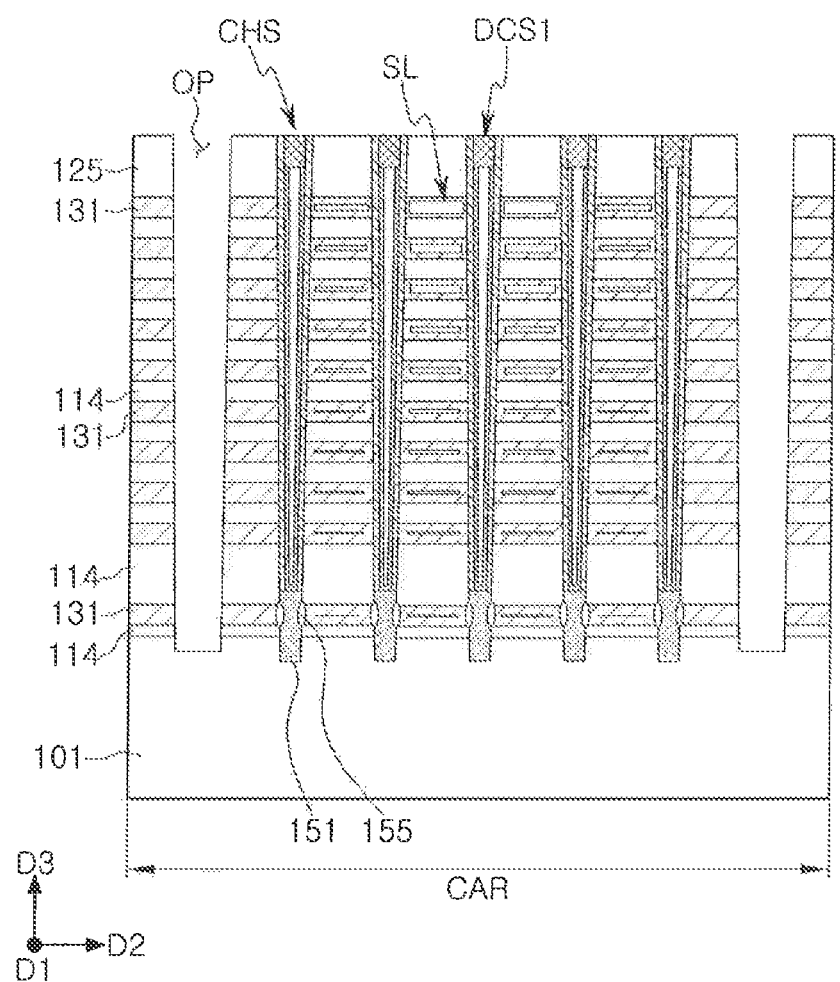

Referring to FIG. 11F, gate electrode layers 131 are formed in the lateral openings LP, and slits SL are formed in the gate electrode layers 131.

The gate electrode layer 131 may include a first conductive layer 131a and a second conductive layer 131b (see FIG. 5). Before forming the second conductive layer 131b, the first conductive layer 131a may be formed first. The first conductive layer 131a may be formed along sidewalls of mold insulation layers 114 and channel structures CHS in lateral openings LP.

The second conductive layer 131b may be formed by, for example, a CVD process. The CVD process may be performed simultaneously with a source gas and a reaction gas. For example, when the second conductive layer 131b is made of tungsten (W), the source gas may be at least one of $WF_6$, $WCl_6$, $WCl_5$, $W(CO)_6$, $W(C_6H_6)_2$, $W(PF_3)_6$, $W(allyl)_4$ and $(1,5\text{-COD})W(CO)_4$, $(C_5H_5)_2WH_2$. The reaction gas may be at least one of $B_2H_6$, $SiH_4$, and $H_2$.

The second conductive layer 131b may be formed by, for example, an atomic layer deposition (ALD) process. In this case, gases for deposition of the second conductive layer 131b may be injected, as illustrated in FIG. 12. The ALD process may include supplying the source gas and supplying the reactant gas, and a purge gas may be injected after each of the supply operations. The operations may include one deposition cycle, and the deposition cycle may be repeated.

The source gas may include a precursor containing a material forming the second conductive layer 131b. The precursor may be supplied in a gaseous state, or may be supplied by using an inert gas as a carrier gas. The reaction gas may be a gas that oxidizes or reduces the precursor. The purge gas may be, for example, Ar, He, $N_2$, etc., and remaining by-products, source gas and reactive gas, not adsorbed, may be removed. For example, when the second conductive layer 131b is made of tungsten (W), the source gas may be $WF_6$, $WCl_6$, $WCl_5$, $W(CO)_6$, $W(C_6H_6)_2$, $W(PF_3)_6$, $W(allyl)_4$ and $(1,5\text{-COD})W(CO)_4$, or $(C_5H_5)_2WH_2$. The reaction gas may be at least one of $B_2H_6$, $SiH_4$, and $H_2$.

A process temperature may be, for example, in the range of about 150° C. to about 450° C., and a process pressure may range, for example, from about 1 Torr to about 90 Torr. The process temperature and the process pressure may be varied depending on a material of the source gas. When the process temperature is higher or lower than the above temperature range, an atomic layer deposition, for example, a self-limiting growth, may not occur. When the process pressure is lower than the defined pressure range, a reaction between the source gas and the reaction gas may not be sufficient.

A purging by the purge gas may be enhanced to form the second conductive layer 131b so that the second conductive layer 131b contains impurities at a low concentration. The purge gas supply time and/or supply amount may be increased. For example, a supply time ($\Delta T1$) of the purge gas after a supply of the source gas may be longer than a supply time ($\Delta T2$) of the purge gas after a supply of the reactive gas. However, exemplary embodiments are not limited thereto.

According to exemplary embodiments, the second conductive layer 131b does not include impurities such as, for example, fluorine (F), chlorine (Cl), carbon (C), etc., or may include such impurities in a low concentration. According to exemplary embodiments, the impurities remaining in slits SL are absent, or are present in a low concentration.

A conductive material constituting a gate electrode layer 131 formed in a separation region OP is removed by the etching process so that gate electrode layers 131 are disposed only in lateral openings LP (see FIG. 11E). The etching process may be, for example, a wet etching process.

In an exemplary embodiment, an annealing process for the gate electrode layers 131 may be further performed. A portion of impurities may be removed by the annealing process so that the gate electrode layer 131 does not contain excessive impurities.

Referring again to FIG. 6, the insulation layer 182 and the separation patterns 180 are formed in the isolation regions OP.

The insulation layer 182 may be formed in the form of a spacer by depositing an insulating material, and the insulating material may be removed from the substrate 101 to expose the upper surface of the substrate 101.

A conductive material is deposited in the insulation layer 182, and a planarization process is performed to form the separation patterns 180.

According to an exemplary embodiment, an RC delay difference between an upper end word line and a lower end word line may be improved by forming a slit in the upper end word line to increase the resistance of the upper end word line.

Further, by improving an RC delay difference between an upper end word line and a lower word line, the difference between programming speed and erasing speed may be improved.

In exemplary embodiments of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an exemplary embodiment of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A vertical-type memory device, comprising:
   a substrate comprising a cell array region and a connection region disposed adjacent to the cell array region;
   a plurality of gate electrode layers stacked on the cell array region and the connection region, wherein the plurality of gate electrode layers forms a stepped structure in the connection region;
   a plurality of channel structures disposed in the cell array region, wherein the plurality of channel structures penetrates the plurality of gate electrode layers;
   a plurality of dummy channel structures disposed in the connection region, wherein the plurality of dummy channel structures penetrates at least one of the plurality of gate electrode layers; and
   a plurality of slits disposed in the plurality of gate electrode layers in the cell array region, wherein the plurality of slits is disposed between the plurality of channel structures.

2. The vertical-type memory device according to claim 1, wherein the plurality of slits comprises empty spaces surrounded by a conductive material forming the plurality of gate electrode layers.

3. The vertical-type memory device according to claim 1, wherein the plurality of slits is arranged in a zigzag pattern.

4. The vertical-type memory device according to claim 1, wherein a size of the plurality of slits decreases as the slits are disposed closer to the substrate.

5. The vertical-type memory device according to claim 1, wherein a diameter of the plurality of channel structures decreases as the plurality of channel structures is disposed closer to the substrate.

6. The vertical-type memory device according to claim 1, wherein a spacing between the plurality of channel structures increases as the plurality of channel structures is disposed closer to the substrate.

7. The vertical-type memory device according to claim 1, wherein a spacing between adjacent channel structures of the plurality of channel structures is narrower than a spacing between adjacent dummy channel structures of the plurality of dummy channel structures.

8. The vertical-type memory device according to claim 1, further comprising:
   a separation pattern penetrating the gate electrode layers and extending in one direction on the substrate,
   wherein a size of the plurality of slits increases as the slits are disposed further from the separation pattern.

9. The vertical-type memory device according to claim 1, wherein each of the plurality of slits has opposite side surfaces, and the side surfaces have a concave shape.

10. A vertical-type memory device, comprising:
    a substrate;
    a first gate electrode layer extending in a first direction on the substrate;
    a second gate electrode layer extending in the first direction on the substrate, wherein the second gate electrode layer is disposed on the first gate electrode layer;
    a plurality of channel structures penetrating the first gate electrode layer and the second gate electrode layer;
    a first slit disposed in the first gate electrode layer; and
    a second slit disposed in the second gate electrode layer,
    wherein the first slit and the second slit are disposed between the channel structures, and a size of the second slit is larger than a size of the first slit.

11. The vertical-type memory device according to claim 10, wherein a spacing between the channel structures increases as the Channel structures are disposed closer to the substrate.

12. The vertical-type memory device according to claim 10, further comprising:
    a separation pattern penetrating the first and second gate electrode layers and extending in the first direction on the substrate,
    wherein the first slit is one of a plurality of first slits spaced apart from one another, and the second slit is one of a plurality of second slits spaced apart from one another,
    wherein sizes of the plurality of first slits and the plurality of second slits increase as the plurality of first slits and the plurality of second slits are disposed further from the separation pattern.

13. The vertical-type memory device according to claim 12, wherein the plurality of first slits and the plurality of second slits are arranged in a zigzag pattern.

14. The vertical-type memory device according to claim 10, wherein the first and second gate electrode layers comprise a first conductive layer and a second conductive layer covering the first conductive layer, respectively, and the first and second slits are surrounded by the second conductive layer.

15. The vertical-type memory device according to claim 10,
    wherein the channel structures comprise a channel layer penetrating the first and second gate electrode layers, and a gate dielectric layer disposed between the channel layer and the first and second gate electrode layers, respectively,
    wherein the gate dielectric layer comprises a charge trap layer.

16. The vertical-type memory device according to claim 15, wherein the channel structures further comprise an epitaxial layer disposed between the channel layer and the substrate.

17. A vertical-type memory device, comprising:
    a substrate;
    a plurality of gate electrode layers stacked on the substrate and extending in a first direction on the substrate;
    a plurality of channel structures penetrating the plurality of gate electrode layers; and
    a plurality of separation patterns penetrating the plurality of gate electrode layers,
    wherein the plurality of separation patterns extends in the first direction, and the separation patterns are spaced apart from one another in a second direction that is substantially perpendicular to the first direction,
    wherein the plurality of gate electrode layers comprises a plurality of slits disposed between the plurality of channel structures.

18. The vertical-type memory device according to claim 17, wherein a size of the plurality of slits decreases as the plurality of slits is disposed closer to the substrate.

19. The vertical-type memory device according to claim 17, wherein a size of the plurality of slits increases as a distance between the plurality of slits and the separation patterns increases in the second direction.

* * * * *